(12) United States Patent
Sivakumar

(10) Patent No.: US 12,044,712 B2
(45) Date of Patent: Jul. 23, 2024

(54) BOOSTING CIRCUITS AND METHODS FOR COMPARATOR CIRCUITS

(71) Applicant: QUALCOMM Incorporated, San Diego, CA (US)

(72) Inventor: Ramkumar Sivakumar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/045,050

(22) Filed: Oct. 7, 2022

(65) Prior Publication Data

US 2024/0118320 A1 Apr. 11, 2024

(51) Int. Cl.
*G01R 19/00* (2006.01)
*G05F 3/26* (2006.01)
*H02J 7/00* (2006.01)

(52) U.S. Cl.
CPC ........... *G01R 19/0038* (2013.01); *G05F 3/26* (2013.01); *H02J 7/00034* (2020.01); *H02J 2207/30* (2020.01)

(58) Field of Classification Search
None
See application file for complete search history.

(56) References Cited

U.S. PATENT DOCUMENTS

| | | | |
|---|---|---|---|
| 4,887,048 A | 12/1989 | Krenik et al. | |
| 5,621,340 A | 4/1997 | Lee et al. | |
| 6,922,319 B2 * | 7/2005 | Akita | G01R 19/16542 361/90 |
| 7,236,015 B2 | 6/2007 | Eberlein | |
| 7,339,430 B2 * | 3/2008 | Chiu | H03F 3/45708 330/261 |
| 8,330,499 B2 * | 12/2012 | Hirose | H03K 5/2481 327/65 |
| 8,436,682 B1 * | 5/2013 | Parkhurst | H03F 3/45183 330/261 |
| 8,896,378 B2 * | 11/2014 | Hirose | H03F 3/45179 330/259 |
| 9,866,215 B2 | 1/2018 | Atkinson et al. | |
| 9,971,728 B2 * | 5/2018 | Burgers | G06F 13/4072 |
| 10,090,833 B2 | 10/2018 | Menezes | |
| 10,165,355 B2 * | 12/2018 | Negi | H04R 3/00 |
| 10,211,782 B1 * | 2/2019 | Banerjee | H03F 3/4521 |
| 10,289,140 B2 | 5/2019 | Petenyi | |
| 10,498,171 B2 * | 12/2019 | Radke | H02J 50/12 |

(Continued)

FOREIGN PATENT DOCUMENTS

EP 1355427 B1 12/2006

OTHER PUBLICATIONS

Bruce Trump, OP Amps Used as Comparators—is it okay?, May 14, 2012, Texas Instruments, https://e2e.ti.com/blogs_/archives/b/thesignal/posts/op-amps-used-as-comparators-is-it-okay accessed Mar. 6, 24 (Year: 2012).*

(Continued)

*Primary Examiner* — Thomas J. Hiltunen
(74) *Attorney, Agent, or Firm* — Haynes and Boone, LLP

(57) ABSTRACT

A voltage comparator includes a boosting circuit that is configured to boost a direct current (DC) bias of the comparator. The boosting circuit includes transistors that are different in size, a larger one of the transistors being configured to add a portion of boosting current to a bias current.

15 Claims, 4 Drawing Sheets

(56) References Cited

U.S. PATENT DOCUMENTS

| | | |
|---|---|---|
| 11,082,012 B2 * | 8/2021 | Pandey ................ H03M 1/66 |
| 11,323,026 B2 | 5/2022 | Oshita et al. |
| 2018/0374705 A1 | 12/2018 | Dhanasekaran et al. |
| 2021/0067151 A1 * | 3/2021 | Martins ............... H03F 3/45183 |
| 2021/0367383 A1 | 11/2021 | Dhanasekaran |

OTHER PUBLICATIONS

Degrauwe M.G., et al., "Adaptive Biasing CMOS Amplifiers," IEEE Journal of Solid-State Circuits, Jun. 1982, vol. SC-17, No. 3, pp. 522-528, USA, XP093119567, figure 11.
Partial International Search Report—PCT/US2023/033950—ISA/EPO—Jan. 31, 2024.

* cited by examiner

BOOSTING CIRCUITS AND METHODS FOR COMPARATOR CIRCUITS

TECHNICAL FIELD

This application relates to comparators, and more particularly to comparators with direct current (DC) bias boosting.

BACKGROUND

Comparator circuits are used in many applications. For instance, some protections circuits in battery-operated applications may include comparators that monitor overvoltage conditions. Such comparators may be used to respond quickly enough to ensure that high voltages within the system do not last long enough to cause damage to integrated circuit devices. For instance, IEC-61000-4-5 puts constraints on reliability of a connector pin and, hence, the response time of detection circuitry to respond to high-voltage events that may affect that connector pin. Furthermore, since comparators may be considered auxiliary circuits, design power requirements for comparators may be stringent.

There is a need in the art for comparators with increased performance and relatively low power operation.

SUMMARY

In one implementation, a voltage comparator includes: a first current mirror coupled to a first current source; a second current mirror coupled to the first current mirror; a first transistor and a second transistor coupled to the second current mirror and to a first load, wherein the first transistor has a first voltage input, and wherein the second transistor has a second voltage input, an output of the voltage comparator being coupled between the second transistor and the first load; and a third transistor and a fourth transistor coupled to a second current source, the third transistor being coupled to a second load, and the fourth transistor being coupled to the first current mirror, the third transistor having a third voltage input and receiving a first same voltage as the first voltage input, the fourth transistor having a fourth voltage input and receiving a second same voltage as the second voltage input, further wherein the fourth transistor is larger than the third transistor.

In another implementation, a method of comparing a first voltage and a second voltage includes: mirroring a first current in a first current mirror, thereby generating a second current in a second current mirror, the first current mirror being coupled to the second current mirror; applying the first voltage to a first transistor and applying the second voltage to a second transistor, wherein the first transistor and the second transistor are coupled to the second current mirror and to a first load, and wherein the first transistor and the second transistor receive the second current; applying the first voltage to a third transistor and applying the second voltage to a fourth transistor, wherein the third transistor is coupled to a second load, and wherein the fourth transistor is larger than the third transistor and is coupled to the first current mirror, the third transistor and the fourth transistor splitting a boost current, and wherein the first current comprises a portion of the boost current from the fourth transistor added to a bias current; and changing a state of an output of a comparator based at least in part on the first voltage changing in value relative to the second voltage.

In another implementation, a wireless communication device includes: an application processor; an audio signal amplifier; a charging integrated circuit, wherein the application processor, the audio signal amplifier, and the charging integrated circuit are coupled to a set of wires by multiplexing functionality; a data and charging plug coupled to the set of wires; and a voltage comparator coupled to at least one wire of the set of wires, wherein the voltage comparator includes: a boosting circuit having a first transistor and a second transistor coupled to a first current source, wherein the first transistor is gate coupled to a reference voltage, and wherein the second transistor is gate coupled to the at least one wire of the set of wires, wherein the first transistor is configured to conduct a first portion of a first current of the first current source to a first current mirror; a second current source coupled to the first current mirror; a second current mirror coupled to the first current mirror; and a third transistor and a fourth transistor coupled to the second current mirror, the third transistor being gate coupled to the at least one wire of the set of wires, and the fourth transistor is gate coupled to the reference voltage, further wherein the first transistor is larger than the second transistor, the third transistor, and the fourth transistor.

In yet another implementation, a wireless communication device includes: a comparator coupled to a reference voltage and coupled to a wire that is configured to conduct direct current (DC) charging, audio signals, and data; means for biasing the comparator; and means for boosting a DC bias level of the comparator, including splitting a first current from a first current source based at least in part on a difference between the reference voltage and a voltage level of the wire, further including conducting a first portion of the first current additively to a second current in the means for biasing, and conducting a second portion of the first current to a load, wherein a first transistor that is configured to conduct the first portion of the first current is larger than a second transistor that is configured to conduct the second portion of the first current.

These and additional advantages may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
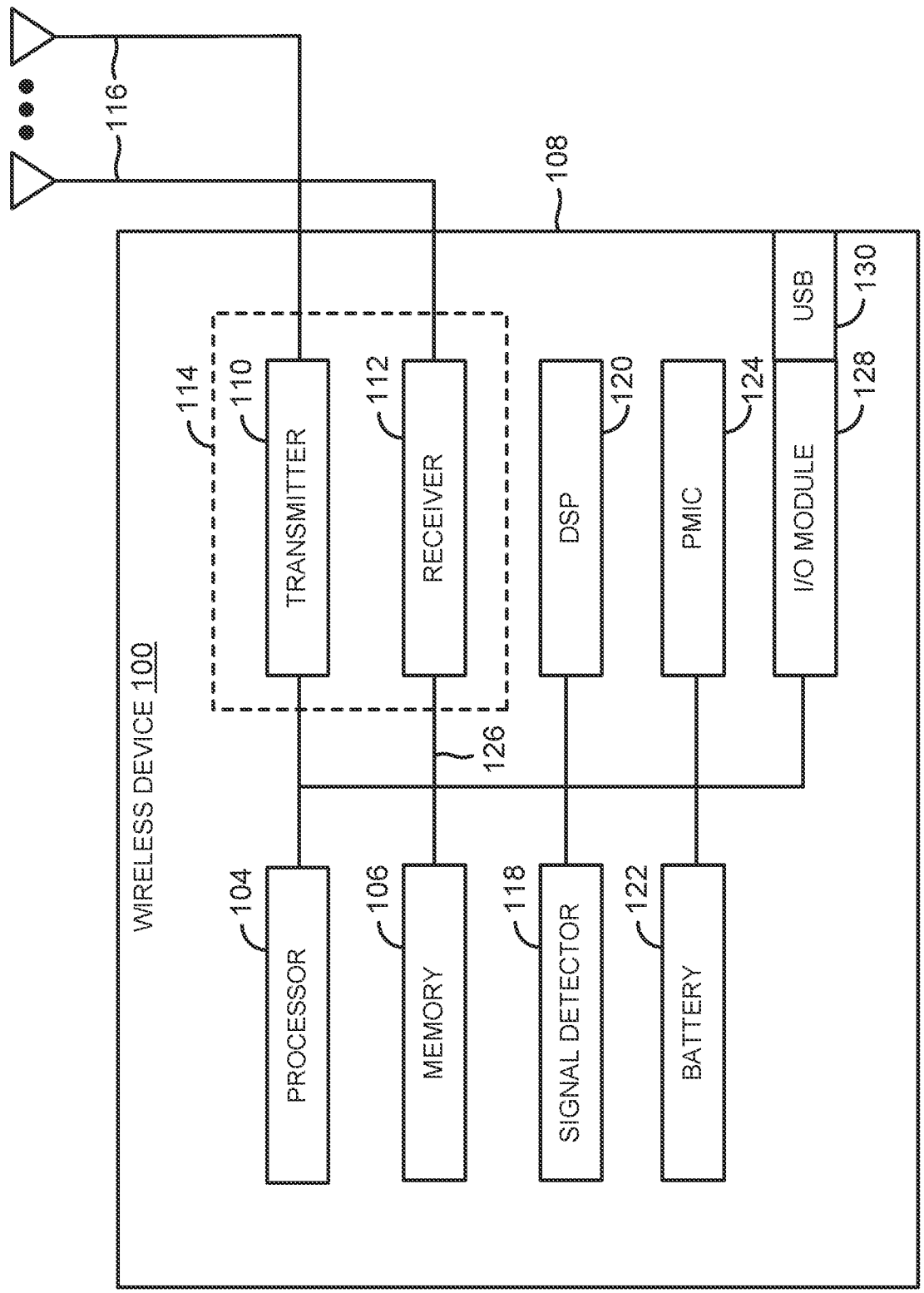
FIG. 1 illustrates a illustrates a block diagram of an example wireless device that includes an overvoltage protection (OVP) circuit, according to one implementation.

In one example, a comparator includes two current mirrors. A first current mirror is coupled to a first current source. A second current mirror is coupled to the first current mirror. The first current mirror may operate to mirror a bias current (Ibias). The second current mirror, by virtue of its being coupled to the first current mirror, also mirrors the bias current.

Continuing with the example, the second current mirror may be coupled to a first set of transistors that are each coupled source-to-drain from the second current mirror to a load. The first set of transistors may be configured to receive a set of input voltages (e.g., INN, INP). The relative voltage levels of the set of input voltages determine how the current is split between the first set of transistors. For instance, INP may normally have a voltage level that is lower than a voltage level of INN. The first set of transistors and the load may be sized so that when a voltage level of INP increases to cross a voltage level of INN, that causes a ratio of current flowing through the set of transistors to cause less current to flow through a first one of the transistors and more current to flow through a second one of the transistors. The additional current flowing through the second one of the transistors may raise a voltage level at a node between that transistor and the load, and that voltage level at the node may be used as an output voltage to indicate that a voltage level of INP is equal to or higher than a voltage level of INN.

However, a requirement of some comparators is relatively quick operation to detect and act upon an overvoltage situation (e.g., when INP rapidly increases). A comparator having the architecture as described above may include some capacitance at the load, where the capacitance takes time to charge. One way to increase the speed of the comparator is to charge the capacitance when INP is rising but before INP crosses INN. Various implementations described herein include a bias boosting circuit that operates to increase the speed of the comparator by charging the capacitance.

An example bias boosting circuit may include a second current source providing a boost current (Iboost). The second current source may provide the boost current to a second set of transistors that are controlled by the set of input voltages INN, INP. The second set of transistors may be replicas of the first set of transistors, so that the second set of transistors includes a transistor that is controlled by INN and is a replica of a transistor of the first set of transistors that is also controlled by INN. The second set of transistors may also include a transistor that is controlled by INP and is a replica of a transistor of the first set of transistors that is also controlled by INP. Further in this example, the replica transistor that is controlled by INN may be larger than the replica transistor that is controlled by INP. In this example, a replica transistor is a transistor that is the same as, or similar to, another transistor in design and implemented on a same chip using same processes as the other transistor, though sizes may be different.

As a voltage level of INP increases, that causes a larger proportion of the boost current Iboost to flow through the replica transistor controlled by INN. The boost circuit is arranged so that the replica transistor that is controlled by INN is coupled to the first current mirror and adds its respective proportion of the boost current Iboost to the bias current Ibias. The additive current (Itotal) is mirrored by the first current mirror and the second current mirror. In other words, as the proportion of the boost current Iboost corresponding to the replica transistor (controlled by INN) increases, that increases an amount of direct current (DC) bias at the first set of transistors, thereby charging the capacitance at the load. The larger relative size of the replica transistor controlled by INN increases its respective proportion of the boost current, thereby further adding to Itotal and the DC bias at the first set of transistors. As a result, the output voltage of the comparator may change from a digital 0 to a digital 1 more quickly during an overvoltage event.

Various implementations may be un-clocked, i.e., providing continuous monitoring of the input voltages. As noted above, the asymmetric nature of the second set of transistors may cause an increase in DC bias current at the first set of transistors even before voltage level of INP crosses the voltage level of INN. This predictive action of the bias circuit is a form of hysteresis that helps to avoid chatter around the trigger threshold that might otherwise be associated with an alternative technique that changes an operating point of transistors in the comparator. In other words, various implementations may provide speed as well as avoiding chatter at the trigger threshold. Furthermore, the boost circuit may be implemented so that during normal operation when INP is below INN, little or no extra current is used compared to a comparator that omits the boost circuit. In other words, the boost circuit may be implemented with little or no power penalty and little or no area penalty.

FIG. 1 illustrates an example device 100 in which aspects of the present disclosure may be implemented. The device 100 may be a battery-operated device such as a cellular phone, a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as direct current (DC)-to-DC conversion, battery charging, power-source selection, voltage scaling, power sequencing, etc. In certain aspects, the PMIC 124 may include a battery charging circuit (e.g., a master-slave battery charging circuit) or other switched-mode power supply. The various components of the device 100 may be coupled together by a bus system 126, which may include a power bus, a control signal bus, and/or a status signal bus in addition to a data bus.

For certain aspects, the device 100 may have an input/output (I/O) module 128 for receiving and/or outputting data and/or power. In certain aspects, the I/O module 128 may include a connector 130, such as a Universal Serial Bus (USB) Type-A (USB-A) receptacle or a USB Type-C (USB-C) receptacle. The pins of the connector 130 may be routed to the processor 104 and/or the PMIC 124 via signal lines of the bus system 126 and/or the I/O module 128, at least some of which may include an overvoltage protection circuit, as further described herein. Also, as described herein, the I/O module 128 may include a coder decoder (codec) chip, the codec chip including an audio signal path and drivers, among other hardware components, to facilitate audio through the connector 130.

Figure 2:
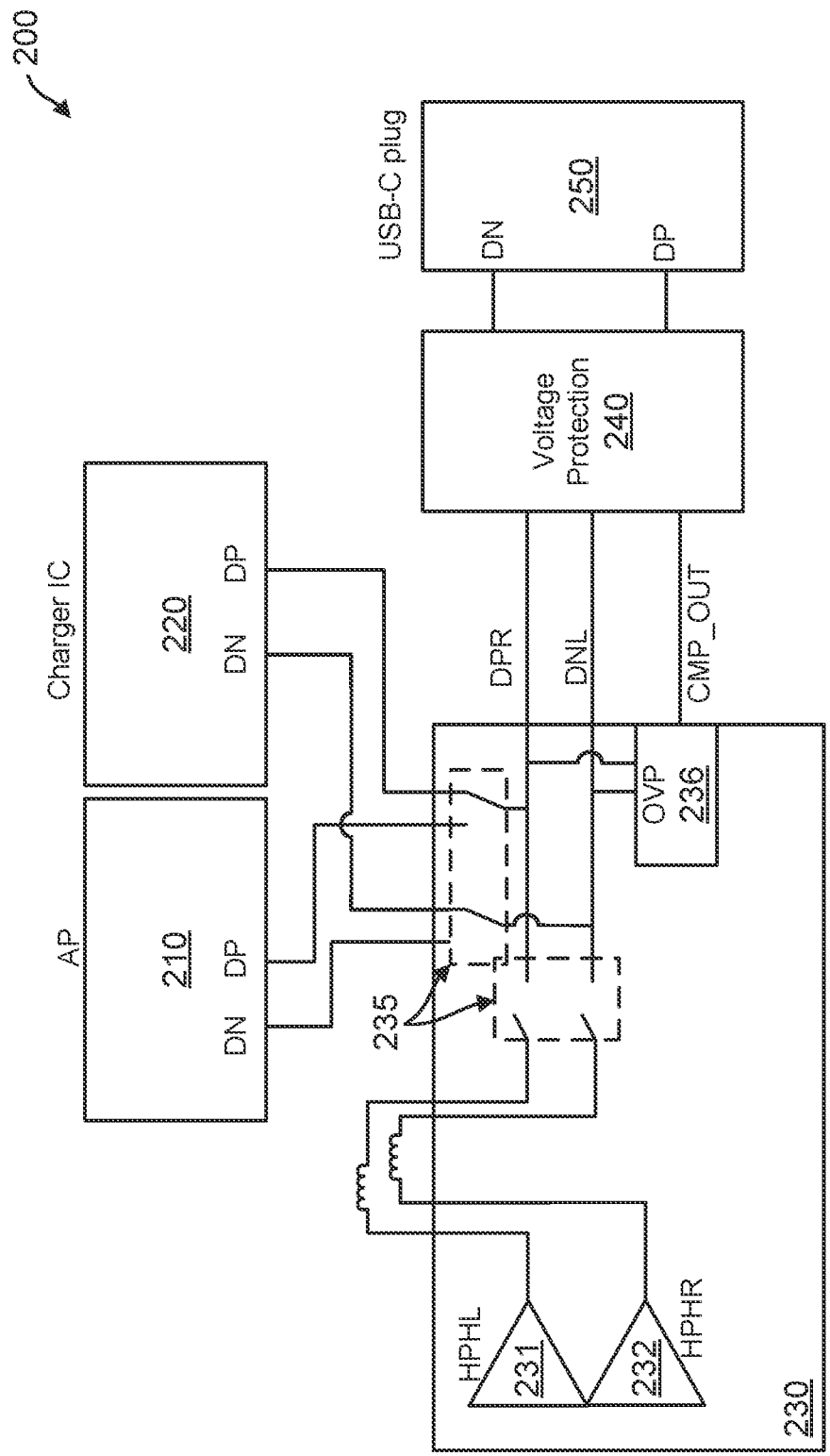
FIG. 2 illustrates an example architecture for multiplexing audio signals, high speed data signals, and charging, while providing overvoltage protection in a device such as the device of FIG. 1, according to one implementation.

FIG. 2 is an illustration of example hardware architecture 200, which provides more detail as to how some portions of device 100 may be implemented. For instance, architecture 200 includes application processor 210, which may include some or all of the functionality of processor 104 and DSP 120. In some examples, the application processor 210 may be a system on chip (SOC), which includes multiple processor cores, a digital signal processor (DSP), memory, and the like. For instance, one or more of the processor cores may run an operating system having a kernel that provides functionality for, e.g., controlling the multiplexing functionality 235. The architecture 200 also includes the charger integrated circuit 220, which may include some or all of the functionality of PMIC 124.

Codec chip 230 may provide some or all of the functionality of I/O module 128, and also may include connector 130 to physically interface with plug 250. In this example, plug 250 is a USB-C plug, though the scope of implementations may include any appropriate plug, whether conforming to a standard or otherwise. The codec chip 230 interfaces with both an audio signal path and USB data path. For instance, codec chip 230 receives high-speed data on the DN and DP data lines from the USB-C plug 250. The codec chip 230 may then route that high-speed data to the application processor 210.

Additionally, the codec chip includes audio signal amplifiers 231, 232 for the left channel and right channel, respectively. Analog audio signals may be output to the USB-C plug 250 for use by, e.g., a wired headphone. Of note as well, the USB-C plug 250 may be used for charging so that DC power may be provided from the USB-C plug 250 to the charger IC 220.

To facilitate the shared connections, codec chip 230 includes multiplexing functionality 235, which in FIG. 2 is illustrated as multiple switches. For instance, when audio signals are being transmitted from the audio signal amplifiers 231, 232 to the USB-C plug 250, switches may be turned on to create an electrical path from the audio signal amplifiers 231, 232 to the USB-C plug 250, whereas other switches may be turned off to isolate the application processor 210 from the audio signal path and to isolate the charger IC 220 from the audio signal path as well. Similarly, when the application processor 210 is transmitting and receiving digital data over the DP and DN pins with the USB-C plug 250, the charger IC 220 and the audio signal amplifiers 231, 232 may be isolated from the USB-C plug by the multiplexing functionality 235. Also, when the charger IC 220 is receiving DC power over the DN and DP pins of the USB-C plug 250, the multiplexing functionality 235 may create an electrical connection from the charger IC 220 to the USB-C plug 250 while isolating the application processor 210 and the audio signal amplifiers 231, 232 from the DC charging power. The multiplexing functionality 235 may be controlled, e.g., by the application processor 210 or some other appropriate hardware or software logic within the architecture 200.

Codec chip 230 also includes overvoltage protection circuit 236, which monitors the signal levels on the lines DPR and DNL and may activate voltage protection circuit 240 using the signal CMP_OUT.

DC overvoltage fault conditions may occur at one or more pins of a connector, such as a USB-A or USB-C receptacle, of a device (e.g., device 100). An overvoltage protection (OVP) scheme may be employed, as illustrated in architecture 200, to prevent electrical over stress (EOS) damage to chipset integrated circuits (ICs) having various signal nodes for coupling to the connector pins, such as the DN and DP pins. In this example, the OVP scheme is illustrated by overvoltage protection circuit 236 and voltage protection circuit 240. Specifically, the OVP scheme may be implemented between the DP and DN pins of the USB-C plug 250 and pins (e.g., the counterpart DP and DN pins) of the application processor 210 used for running applications in an operating system. In an example overvoltage scenario, a USB-C cord (not shown), that interfaces with USB-C plug 250, has a buildup of static charge. The static charge may be discharged when connectors of the cord physically create electrical connections with the DN and DP pins of the USB-C plug 250. Without overvoltage protection, electrical current may surge through the codec chip 230 and the application processor 210 and potentially cause damage.

The OVP scheme of FIG. 2 seeks to minimize the possibility of damage to the codec chip 230 and the application processor 210 by using the overvoltage protection circuit 236 to detect a surge and then to signal the voltage protection circuit 240 to take action. Action by the voltage protection circuit 240 may include turning on a shunt transistor to feed the surging current to ground, closing a switch to block the current surge from traveling from the USB-C plug 250 to the codec chip 230, and/or other appropriate measures.

Various implementations herein include an improved comparator circuit within the overvoltage protection circuit 236. The improved comparator circuit may provide accurate detection of overvoltage conditions and provide quick signaling to the voltage protection circuit 240.

Figure 3:
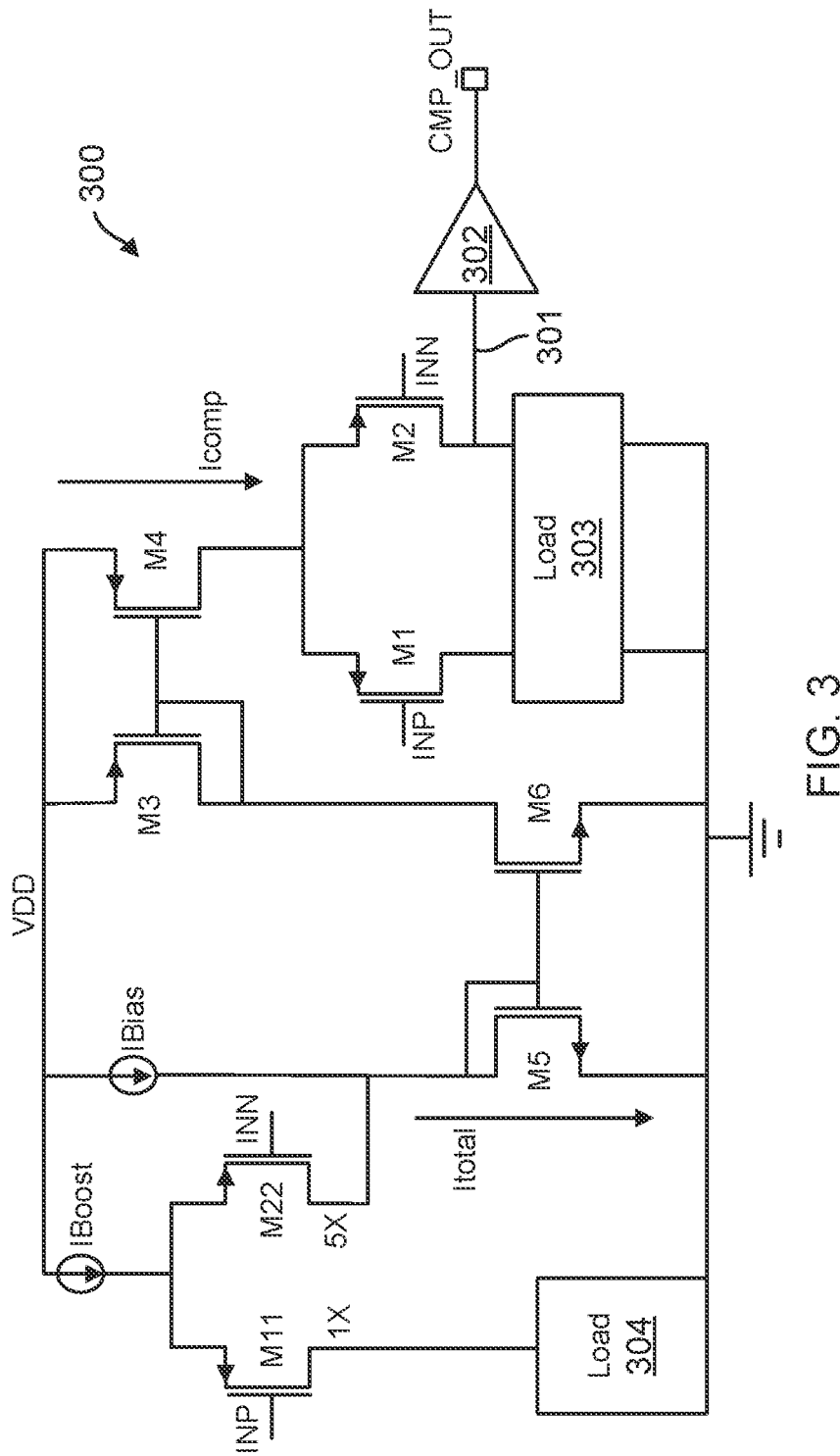
FIG. 3 illustrates an example voltage comparator, which may be used in the implementation of FIG. 2, according to one implementation.

FIG. 3 is an illustration of voltage comparator 300, which may be implemented within the overvoltage protection circuit 236 of FIG. 2, according to one implementation.

The voltage comparator 300 includes a first current mirror, illustrated by transistors M5 and M6. The first current mirror is coupled to a first current source labeled Ibias. The voltage comparator 300 also includes a second current mirror, illustrated by transistors M3 and M4, and the second current mirror is coupled to the first current mirror.

Looking now to transistors M1 and M2, they are coupled to the second current mirror and coupled to the first load 303. Specifically, the transistors M1 and M2 are arranged so that their sources are both coupled to the drain of transistor M4, and they each receive a respective portion of the current Icomp.

Transistor M1 has as its input INP, which is a voltage that is associated with the wire labeled DPR in FIG. 2. The wire labeled DPR may be used for analog audio signals, DC charging, or high-speed data, as explained above with respect to FIG. 2. Additionally or alternatively, INP may be a voltage that is associated with the wire labeled DNL in FIG. 2, and DNL may also be used for analog audio signals, DC charging, or high-speed data. Both DPR and DNL couple the multiplexer functionality 235 with the voltage protection circuit 240, and both DPR and DNL are monitored by the overvoltage protection circuit 236. In fact, some examples may implement two different voltage comparators 300 in the overvoltage protection circuit 236—one voltage comparator 300 to monitor a voltage level on the DPR wire and a second voltage comparator 300 to monitor a voltage level on the DNL wire.

Transistor M2 has as its input INN, which may be a reference voltage. The level of the reference voltage may be set to any appropriate value, which may be determined in simulation or testing to provide satisfactory overvoltage detection for a given application. The output of the voltage comparator 300 is labeled CMP_OUT, and it is taken from node 301, which is between the drain of transistor M2 and the load 303. The voltage from node 301 is provided to buffer 302, and the output of the buffer 302 is the output of the comparator, CMP_OUT.

Transistors M11 and M22 are coupled to a current source Iboost. Transistor M11 is coupled to a second load 304, and transistor M22 is coupled to the first current mirror by its drain. Specifically, transistor M22 is coupled to the second current mirror between the current source Ibias and the drain of transistor M5. Transistor M11 is coupled by its drain to the load 304. Both transistors M11 and M22 are coupled to each other by their sources and to the current source Iboost. The transistors M11 and M22 are configured to each conduct a respective portion of the current from the current source Iboost, and transistor M22 adds its respective portion of the Iboost current to the current mirror that includes transistors M5.

In the example of FIG. 3, transistor M11 is a replica of transistor M1, and transistor M22 is a replica of transistor M2. Further in this example, a replica transistor is a transistor that is the same as, or similar to, another transistor in design and implemented on a same chip using same processes as the other transistor. While transistors M11, M1, and M2 are a same size (e.g., having a same number of fins), transistor M22 is larger by a factor of five. The increased size of transistor M22 allows transistor M22 to have a smaller on state resistance and conduct more current at a given gate-source voltage.

Further in this example, transistors M1, M2, M3, M4, M11, and M22 are p-channel metal oxide semiconductor (PMOS) transistors, and transistors M5 and M6 are n-channel metal oxide semiconductor (NMOS) transistors. However, the scope of implementations is not limited to any type of transistor, as other solutions may use different devices. Further, some implantations may scale M11 and M22 so that M11 may be a different size than M1, and M22 may then be some scaled size relative to M11. In other words, the scope of implementations is not limited to transistors M11, M1, and M2 being a same size.

VDD is a voltage supply. The current Ibias is a DC bias current, it is applied to the drain of transistor M5. The current Ibias is mirrored through a first current mirror comprising transistors M5 and M6 and a second current mirror comprising transistors M3 and M4. The comparator is not clocked and, thus, constantly monitors the voltages INP, INN.

Normally, the input voltage INP is lower than the input voltage INN, causing the comparator to output a low voltage (a digital 0) at node 301 and at node CMP_OUT. The comparator shown here outputs a high voltage (a digital 1) at node 301 and at node CMP_OUT when the input voltage INP is either equal to or higher than the input voltage INN. In a scenario in which the input voltage INP is lower than the input voltage INN, the transistor M1 is on, and the transistor M2 is off or mostly off so that almost all of the current through M4 passes through transistor M1 to ground. As the level of INP approaches the level of INN, transistor M1 conducts less current and transistor M2 conducts more current, thereby splitting the current between transistors M1 and M2. As more current is conducted through M2, the voltage level at node 301 gets higher, and that voltage level is interpreted as a digital 1 should the input voltage INP be equal to or higher than the input voltage INN.

The current source Iboost and the transistors M11, M22 are configured as a boost circuit to boost the bias current Itotal as the voltage level of INP increases and approaches the voltage level of the reference voltage INN. The current through transistor M22 is additive to the current Ibias to create Itotal through transistor M5. When the input voltage INP is lower than the input voltage INN, the amount of current through transistor M22 is small, however as the voltage level of INP increases and approaches the voltage level of INN, more current is passed through transistor M22. Since the current Itotal, which is the sum of Ibias and Iboost, is mirrored through transistors M5, M6, M3, and M4, that also increases the current through both transistors M1, M2. In fact, as the voltage level of INP increases and approaches the voltage level of INN, transistor M1 conducts less current and transistor M2 conducts more current. As a result, as the voltage level of INP increases and approaches the voltage level of INN, the current boost due to the current through transistor M22 is mirrored through transistor M4 (Icomp) and causes the voltage at node 301 to rise more quickly and be interpreted as a digital 1 more quickly.

Put another way, as the current Itotal increases, and it is mirrored through transistor M4 as current Icomp, and it charges internal nodes, which may be interpreted as parasitic capacitance, specifically at node 301. For instance, there may be parasitic capacitance attributable to transistor M2 as well as load 303 at node 301, and that parasitic capacitance may be charged as the portion of Icomp through transistor M2 increases. This charging effect at node 301 may allow the voltage at node 301 to rise more quickly and cause a digital 1 to be detected more quickly. In one example, when CMP_OUT is a digital zero, that may turn on or turn off a switch at voltage protection circuit 240

The voltage comparator 300 having transistors M11, M22 may include advantages over other comparators. For instance, the voltage comparator 300 may allow a quicker transition from a digital 0 to a digital 1 at node 301. In an application that uses voltage comparator 300 as a protection circuit to protect further downstream devices from a high voltage, voltage comparator 300 may provide additional protection due to its quick switching speed. Also, the design of voltage comparator 300 results in only a slight increase in silicon area and only a slight increase or no increase in power use, compared to a comparator without the boosting circuit. Specifically, the voltage level of INP is expected during normal operation to be low enough so that the proportion of the Iboost current carried by transistor M11 is relatively large, and the proportion of current carried by transistor M22 is relatively small. Thus, during normal operation, the current Itotal is approximately equal to the current Ibias, and little or no additional current is mirrored at transistors M1 and M2. In other words, when INP remains low during normal operation compared to INN, there may be little or no wasted power.

The scope of implementations is not limited to the specific example of FIG. 3. For example, various designs may use a different relative size of transistor M22 with respect to the other transistors M1, M2, and M11. The relative size of transistor M22, as well as the sizes of the currents Iboost and Ibias and the impedances of loads 304, 303 may be selected to provide an appropriate amount of predictive voltage rise at the node 301 that is appropriate for a given application. Furthermore, the buffer 302 may be designed to have an amount of gain that may be interpreted as a digital 1 by a downstream source (e.g., voltage protection circuit 240) when the value of INP is equal to or higher than the value of INN.

An example method for operating a comparator will now be discussed with reference to the flowchart shown in FIG. 4. The method 400 may be performed by an over voltage protection circuit, such as illustrated in FIG. 2 as it operates to monitor for, and detect, over voltage conditions. The voltage comparator functions may be performed by a voltage comparator, such as voltage comparator 300 of FIG. 3.

At action 410, the method includes mirroring a first current (e.g., Itotal) in a first current mirror, thereby generating a second current (e.g., Icomp) in a second current mirror. In this example, the first current mirror is coupled to the second current mirror. Such an arrangement is illustrated in FIG. 3, where the first current mirror includes transistors M5 and M6, and the second current mirror includes transistors M3 and M4.

At action 420, the method includes applying a first voltage to a first transistor and applying a second voltage to a second transistor. An example is shown in FIG. 3, in which INP is applied to the gate of transistor M1, and a reference voltage INN is applied to the gate of transistor M2. Further in this example, the first transistor and the second transistor are coupled between the second current mirror and a first load, and the first transistor and the second transistor, collectively, receive the first current and split the first current into respective portions.

At action 430, the method includes applying the first voltage to a third transistor and applying the second voltage to a fourth transistor. For instance, as shown in FIG. 3, transistor M11 receives at its gate the voltage INP, and the transistor M22 receives at its gate the voltage INN.

Continuing with action 430, the third transistor and the fourth transistor split a boost current (e.g., Iboost), and the fourth transistor is coupled to the first current mirror so that its respective portion of the boost current is added to a bias current (e.g., Ibias) in the first current mirror. As a result, the current Ibias is added to the portion of the boost current attributable to the fourth transistor (e.g., M22) to provide an additive current (e.g., Itotal).

As noted above, during normal operation when INP has a voltage level below that of the reference voltage INN, the current Itotal is substantially equal to the current Ibias. However, as the proportion of Iboost attributable to the transistor M22 increases, Itotal also increases, as does Icomp.

At action 440, the method includes changing a state of an output of a comparator in response to the first voltage changing in value relative to the second voltage. For instance, as the voltage INP increases and approaches the voltage level of INN, the output state of the comparator may be a digital 0. However, once the voltage INP is equal to or higher than the voltage level of the reference voltage INN, the output of the comparator goes to a digital 1. In the example of FIG. 3, the buffer 302 applies a gain to the voltage at node 301, and the voltage comparator 300 is designed so that the voltage at node 301 is seen as a digital 1 after the gain is applied. For instance, the size of transistor M2, the impedance of the load 303, and the size of Icomp may be designed so that when the voltage level of INP is greater than or equal to the voltage level of INN, the voltage level seen at CMP_OUT is at a level that is interpreted as a digital 1. However, the scope of implementations is not limited to outputting a digital 1 when the voltage level of INP crosses INN.

Various voltage comparator implementations may include predictive bias boosting so that when the voltage level of INP rises but has not yet reached the voltage level of INN, a proportion of current attributable to transistor M22 increases, as does the proportion of current attributable to transistor M2. The increased proportion of current attributable to transistor M2 may then charge a capacitance at an output of the comparator (e.g., at node 301). The charging of the capacitance allows the voltage level at the node rise but not necessarily rise to a level that would be interpreted as a state change. Rather, the voltage comparator is designed so that the voltage at the node is associated with the state change upon the voltage level of INP being greater than or equal to the voltage level of INN.

Figure 4:
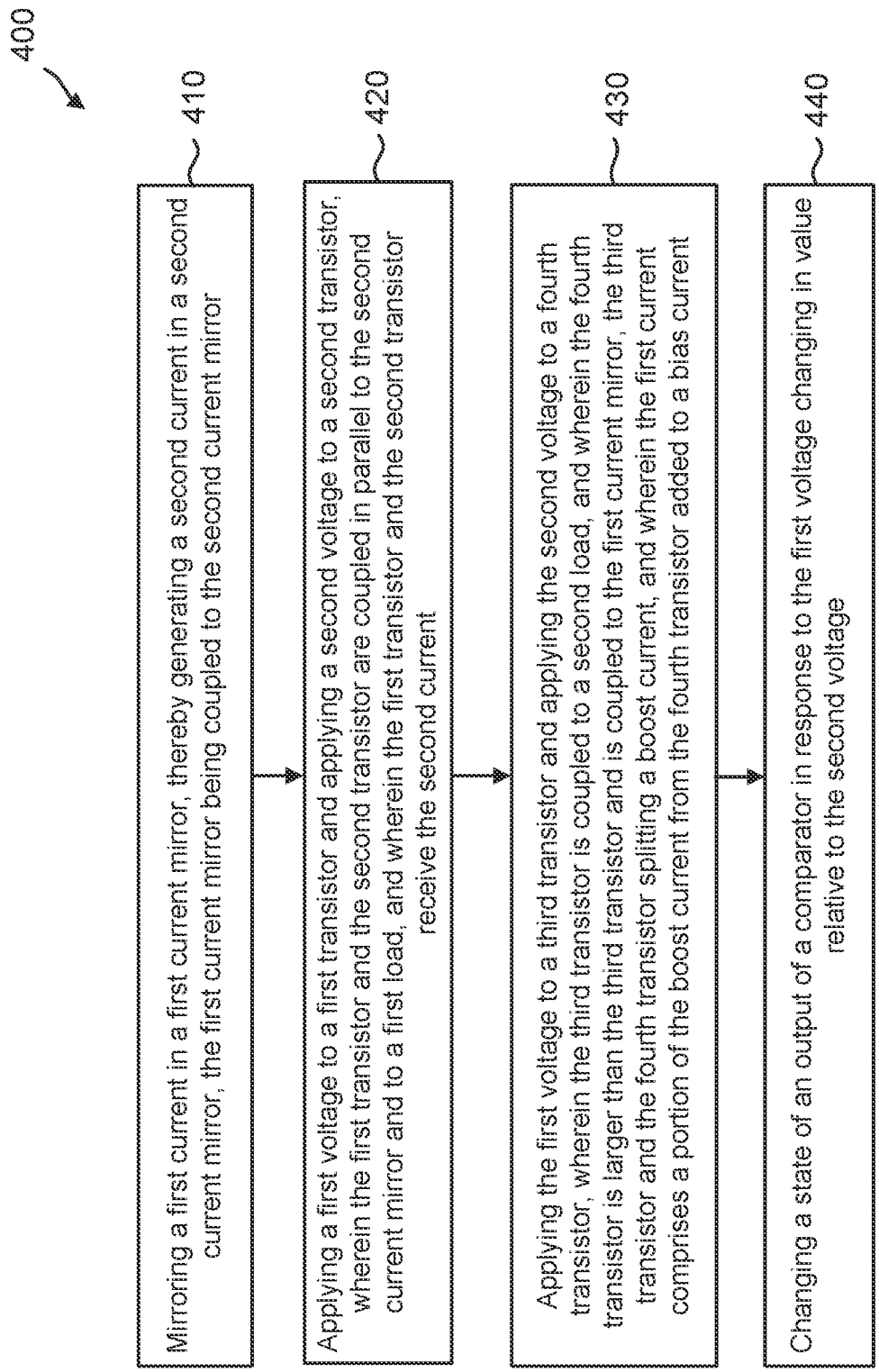
FIG. 4 illustrates a flowchart of an example method that may be performed by overvoltage scheme of FIG. 2.

The scope of implementations is not limited to the series of actions described with respect to FIG. 4. Rather, other implementations may add, omit, rearrange, or modify one or more of the actions. For instance, during operation of the comparator, the changed state of the output of the comparator may be interpreted as either a digital 1 or a digital 0 at a voltage protection circuit, such as voltage protection circuit 240 of FIG. 2. In one example, the voltage protection circuit 240 includes a shunt transistor (not shown), which receives at its gate CMP_OUT, and the changed state of the comparator causes the shunt transistor to turn on so that a surge current at INP is directed to ground.

In another example, the voltage protection circuit 240 includes a series transistor that is controlled by CMP_OUT so that it turns off at the state change and blocks a surge current from reaching the codec chip 230. The scope of implementations is not limited to any particular voltage protection circuit 240, as any appropriate structure for protecting the application processor 210 and codec chip 230 from an overvoltage state may be used.

Furthermore, an overvoltage condition is expected to exist for only a fraction of a second, and once that fraction of a second is over, the voltage level of INP will have returned to a normal operating range below the reference voltage level INN. When the voltage level of INP decreases so that it is less than the voltage level of INN, the state of the voltage comparator may change accordingly. For instance, if an overvoltage condition results in a state of digital 1 at CMP_OUT, a normal voltage condition in which INP is below INN may result in a state of digital 0 at CMP_OUT. Vice versa may also be true in other implementations.

Some implementations may be part of an always-on overvoltage protection scheme. For instance, the voltage comparator 300 may be powered on as long as the reference voltage INN is provided and as long as the bias voltage Ibias and the boost voltage Iboost are provided. Furthermore, the example implementation operates continuously, rather than discretely, and so does not consume clock resources.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A voltage comparator comprising:
   a first current mirror coupled to a first current source;
   a second current mirror coupled to the first current mirror;
   a first transistor and a second transistor coupled to the second current mirror and to a first load, wherein the first transistor has a first voltage input, and wherein the second transistor has a second voltage input, an output of the voltage comparator being coupled between the second transistor and the first load; and
   a third transistor and a fourth transistor coupled to a second current source, the third transistor being coupled to a second load, and the fourth transistor being coupled to the first current mirror, the third transistor having a third voltage input and receiving a first same voltage as the first voltage input, the fourth transistor having a fourth voltage input and receiving a second same voltage as the second voltage input, further wherein the fourth transistor is larger than the third transistor.

2. The voltage comparator of clause 1, wherein the second voltage input is coupled to a direct current (DC) reference voltage.

3. The voltage comparator of clause 2, wherein the first voltage input is coupled to an audio input transmission line.

4. The voltage comparator of any of clauses 1-3, wherein the first voltage input is coupled to a data input transmission line.

5. The voltage comparator of any of clauses 1-4, wherein a drain of the fourth transistor is coupled to a drain of a further transistor in the first current mirror.

6. The voltage comparator of clause 5, wherein a total current through the drain of the further transistor is equal to a current through the drain of the fourth transistor plus a current of the first current source.

7. The voltage comparator of any of clauses 1-6, wherein the third transistor is a replica of the first transistor, and wherein the fourth transistor is a replica of the second transistor.

8. The voltage comparator of any of clauses 1-7, further comprising a buffer coupled to the output of the voltage comparator.

9. A method of comparing a first voltage and a second voltage, the method comprising:
   mirroring a first current in a first current mirror, thereby generating a second current in a second current mirror, the first current mirror being coupled to the second current mirror;
   applying the first voltage to a first transistor and applying the second voltage to a second transistor, wherein the first transistor and the second transistor are coupled to the second current mirror and to a first load, and wherein the first transistor and the second transistor receive the second current;
   applying the first voltage to a third transistor and applying the second voltage to a fourth transistor, wherein the third transistor is coupled to a second load, and wherein the fourth transistor is larger than the third transistor and is coupled to the first current mirror, the third transistor and the fourth transistor splitting a boost current, and wherein the first current comprises a portion of the boost current from the fourth transistor added to a bias current; and
   changing a state of an output of a comparator based at least in part on the first voltage changing in value relative to the second voltage.

10. The method of clause 9, further comprising charging a capacitance in the first load before changing the state of the output of the comparator.

11. The method of any of clauses 9-10, wherein the first voltage changing in value relative to the second voltage includes the first voltage increasing and crossing the second voltage, further wherein a portion of the first current through the second transistor increases and charges a capacitance at the output of the comparator during an increase in the first voltage and before the first voltage crosses the second voltage.

12. The method of any of clauses 9-11, wherein the first voltage changing in value relative to the second voltage is associated with an overvoltage condition, the method further comprising:
   causing a proportion of the second current, associated with the second transistor, to increase as the first voltage increases, wherein the state of the output of the comparator is based at least in part on the proportion of the second current.

13. The method of clause 12, wherein the overvoltage condition includes the first voltage increasing to become greater than or equal to the second voltage, and wherein the second voltage maintains a constant voltage level.

14. The method of clause 13, further comprising:
   controlling a shunt transistor based at least in part on the state of the output of the comparator, including causing the shunt transistor to turn on and conduct a surge current, associated with the overvoltage condition, to ground.

15. The method of any of clauses 9-14, further comprising:
   measuring the output of the comparator at a drain of the second transistor.

16. The method of any of clauses 9-15, wherein the first voltage changing in value includes the first voltage increasing based at least in part on a charging cable being plugged into a wireless device that includes the comparator.

17. A wireless communication device comprising:
   an application processor;
   an audio signal amplifier;
   a charging integrated circuit, wherein the application processor, the audio signal amplifier, and the charging integrated circuit are coupled to a set of wires by multiplexing functionality;
   a data and charging plug coupled to the set of wires; and
   a voltage comparator coupled to at least one wire of the set of wires, wherein the voltage comparator includes:
      a boosting circuit having a first transistor and a second transistor coupled to a first current source, wherein the first transistor is gate coupled to a reference voltage, and wherein the second transistor is gate coupled to the at least one wire of the set of wires, wherein the first transistor is configured to conduct a first portion of a first current of the first current source to a first current mirror;
      a second current source coupled to the first current mirror;
      a second current mirror coupled to the first current mirror; and
      a third transistor and a fourth transistor coupled to the second current mirror, the third transistor being gate coupled to the at least one wire of the set of wires, and the fourth transistor is gate coupled to the reference voltage, further wherein the first transistor is larger than the second transistor, the third transistor, and the fourth transistor.

18. The wireless communication device of clause 17, wherein the data and charging plug comprises a universal serial bus (USB) plug.

19. The wireless communication device of any of clauses 17-18, further comprising:
voltage protection circuit coupled to an output of the voltage comparator and coupled between the data and charging plug and the application processor.

20. The wireless communication device of clause 19, further comprising:
a codec chip that includes the set of wires, the audio signal amplifier, and the multiplexing functionality, wherein the voltage protection circuit is coupled between the data and charging plug and the codec chip.

21. The wireless communication device of any of clauses 17-20, wherein the first transistor and the second transistor are source coupled to the first current source, and wherein the first transistor is drain coupled to the first current mirror.

22. The wireless communication device of clause 21, wherein the third transistor and the fourth transistor are source coupled to the second current mirror and drain coupled to a load.

23. The wireless communication device of clause 22, wherein the first transistor is a replica of the fourth transistor, and wherein the second transistor is a replica of the third transistor.

24. The wireless communication device of clause 23, wherein the second transistor, the third transistor, and the fourth transistor are of a same size.

25. The wireless communication device of any of clauses 17-24, further comprising a buffer coupled to a drain of the fourth transistor.

26. A wireless communication device comprising:
a comparator coupled to a reference voltage and coupled to a wire that is configured to conduct direct current (DC) charging, audio signals, and data;
means for biasing the comparator; and
means for boosting a DC bias level of the comparator, including splitting a first current from a first current source based at least in part on a difference between the reference voltage and a voltage level of the wire, further including conducting a first portion of the first current additively to a second current in the means for biasing, and conducting a second portion of the first current to a load, wherein a first transistor that is configured to conduct the first portion of the first current is larger than a second transistor that is configured to conduct the second portion of the first current.

27. The wireless communication device of clause 26, wherein the means for biasing the comparator comprises:
a second current source coupled to a first current mirror, wherein the first current mirror is coupled to the first transistor; and
a second current mirror coupled to the first current mirror and to a first pair of transistors, wherein an output of the comparator is coupled between the first pair of transistors and a load.

28. The wireless communication device of any of clauses 26-27, further comprising:
means for multiplexing between the DC charging, the audio signals, and the data.

29. The wireless communication device of clause 28, wherein the comparator, the means for biasing the comparator, the means for boosting the DC bias level, and the means for multiplexing are implemented on a coder decoder (codec) chip.

30. The wireless communication device of clause 29, wherein the wire is coupled to a data and charging plug of the wireless communication device.

What is claimed is:

1. A voltage comparator, comprising:
a first current mirror coupled to a first current source;
a second current mirror coupled to the first current mirror;
a first transistor and a second transistor coupled to the second current mirror and to a first load, wherein the first transistor has a first voltage input, and wherein the second transistor has a second voltage input, an output of the voltage comparator being coupled between the second transistor and the first load; and
a third transistor and a fourth transistor coupled to a second current source, the third transistor being coupled to a second load, and the fourth transistor being coupled to the first current mirror, the third transistor having a third voltage input and receiving a first same voltage as the first voltage input, the fourth transistor having a fourth voltage input and receiving a second same voltage as the second voltage input, further wherein the fourth transistor is larger than the third transistor,
wherein a drain of the fourth transistor is coupled to a drain of a further transistor in the first current mirror, and
wherein a total current through the drain of the further transistor is equal to a current through the drain of the fourth transistor plus a current of the first current source.

2. The voltage comparator of claim 1, wherein the third transistor is a replica of the first transistor, and wherein the fourth transistor is a replica of the second transistor.

3. The voltage comparator of claim 1, further comprising a buffer coupled to the output of the voltage comparator.

4. The voltage comparator of claim 1, wherein the second voltage input is coupled to a direct current (DC) reference voltage.

5. The voltage comparator of claim 4, wherein the first voltage input is coupled to an audio input transmission line.

6. The voltage comparator of claim 4, wherein the first voltage input is coupled to a data input transmission line.

7. A wireless communication device comprising:
an application processor;
an audio signal amplifier;
a charging integrated circuit, wherein the application processor, the audio signal amplifier, and the charging integrated circuit are coupled to a set of wires by multiplexing functionality;
a data and charging plug coupled to the set of wires; and
a voltage comparator coupled to at least one wire of the set of wires, wherein the voltage comparator includes:
a first current mirror coupled to a first current source;
a second current mirror coupled to the first current mirror;
a first transistor and a second transistor coupled to the second current mirror and to a first load, wherein the first transistor has a first voltage input, and wherein the second transistor has a second voltage input, an output of the voltage comparator being coupled between the second transistor and the first load; and
a third transistor and a fourth transistor coupled to a second current source, the third transistor being coupled to a second load, and the fourth transistor being coupled to the first current mirror, the third transistor having a third voltage input and receiving a first same voltage as the first voltage input, the fourth transistor having a fourth voltage input and receiving a second same voltage as the second voltage input, further wherein the fourth transistor is larger than the third transistor, wherein a drain of the fourth transistor is coupled to a drain of a further transistor in the first current mirror, and wherein a total current through the drain of the further transistor is equal to a current through the drain of the fourth transistor plus a current of the first current source.

8. The wireless communication device of claim 7, wherein the data and charging plug comprises a universal serial bus (USB) plug.

9. The wireless communication device of claim 7, further comprising:

voltage protection circuit coupled to an output of the voltage comparator and coupled between the data and charging plug and the application processor.

10. The wireless communication device of claim 9, further comprising:

a codec chip that includes the set of wires, the audio signal amplifier, and the multiplexing functionality, wherein the voltage protection circuit is coupled between the data and charging plug and the codec chip.

11. The wireless communication device of claim 7, wherein the third transistor and the fourth transistor are source coupled to the second current source, and wherein the third transistor is drain coupled to the first current mirror.

12. The wireless communication device of claim 11, wherein the first transistor and the second transistor are source coupled to the second current mirror and drain coupled to the first load.

13. The wireless communication device of claim 12, wherein the third transistor is a replica of the first transistor, and wherein the fourth transistor is a replica of the second transistor.

14. The wireless communication device of claim 13, wherein the second transistor, the third transistor, and the first transistor are of a same size.

15. The wireless communication device of claim 7, further comprising a buffer coupled to the output of the voltage comparator.

* * * * *